US008959417B2

(12) United States Patent
Zhu et al.

(10) Patent No.: US 8,959,417 B2
(45) Date of Patent: Feb. 17, 2015

(54) PROVIDING LOW-LATENCY ERROR CORRECTING CODE CAPABILITY FOR MEMORY

(71) Applicant: Marvell World Trade Ltd., St. Michael (BB)

(72) Inventors: Jun Zhu, San Jose, CA (US); Joseph Jun Cao, Los Gatos, CA (US); Sheng Lu, Monte Sereno, CA (US); Pantas Sutardja, Los Gatos, CA (US)

(73) Assignee: Marvell World Trade Ltd., St. Michael (BB)

(*) Notice: Subject to any disclaimer, the term of this patent is extended or adjusted under 35 U.S.C. 154(b) by 71 days.

(21) Appl. No.: 13/682,552

(22) Filed: Nov. 20, 2012

(65) Prior Publication Data
US 2013/0132799 A1     May 23, 2013

Related U.S. Application Data

(60) Provisional application No. 61/623,864, filed on Apr. 13, 2012, provisional application No. 61/563,368, filed on Nov. 23, 2011.

(51) Int. Cl.
*G11C 29/00* (2006.01)
*G06F 11/10* (2006.01)
*G11C 29/04* (2006.01)

(52) U.S. Cl.
CPC .... *G06F 11/1048* (2013.01); *G11C 2029/0411* (2013.01)
USPC ............................ 714/768; 714/785; 714/769

(58) Field of Classification Search
CPC ............ G06F 11/1016; G06F 11/1068; B11B 20/1833
USPC .......................... 714/768, 785, 763, 758, 769
See application file for complete search history.

(56) References Cited

U.S. PATENT DOCUMENTS

| 4,858,349 | A  | * | 8/1989  | Walsh et al. ............... 38/102.91 |
| 6,167,548 | A  | * | 12/2000 | Yamakura ....................... 714/763 |
| 6,193,499 | B1 | * | 2/2001  | Klaus et al. .................... 425/557 |
| 6,662,333 | B1 |   | 12/2003 | Zhang et al. |
| 7,117,421 | B1 |   | 10/2006 | Danilak |
| 7,404,137 | B2 |   | 7/2008  | Lin et al. |
| 7,676,730 | B2 |   | 3/2010  | Haugan et al. |
| 7,975,205 | B2 |   | 7/2011  | Thayer |
| 8,185,801 | B2 |   | 5/2012  | Dell et al. |
| 2002/0029315 | A1 |   | 3/2002  | Williams et al. |
| 2003/0037299 | A1 |   | 2/2003  | Smith |
| 2006/0059406 | A1 |   | 3/2006  | Micheloni et al. |
| 2009/0013233 | A1 |   | 1/2009  | Radke |
| 2009/0144598 | A1 |   | 6/2009  | Yoon et al. |

OTHER PUBLICATIONS

U.S. Office Action in U.S. Appl. No. 13/648,207, dated Jun. 6, 2014, 9 pages.

* cited by examiner

*Primary Examiner* — Fritz Alphonse

(57) ABSTRACT

A memory controller provides low-latency error correcting code (ECC) capability for a memory. In some implementations, the controller is configured to receive a memory access command that includes an address and a length associated with data that is to be transferred to or from the memory device, and transfer one or more bytes of data and one or more bytes of ECC information to or from locations of the memory device associated with the address and the length.

23 Claims, 8 Drawing Sheets

PROVIDING LOW-LATENCY ERROR CORRECTING CODE CAPABILITY FOR MEMORY

CROSS REFERENCE TO RELATED APPLICATION

This disclosure claims the benefit of the priority under 35 U.S.C. §119(e) of U.S. Provisional Application No. 61/563,368, filed on Nov. 23, 2011, titled "Method of Low Latency ECC for Non-ECC DDR Interface Configuration," and U.S. Provisional Application No. 61/623,864, filed on Apr. 13, 2012, titled "Method of Low Latency ECC for Non-ECC DDR Interface Configuration," the disclosures of which are hereby incorporated by reference in their entirety.

FIELD OF USE

The present disclosure relates to error correcting code (ECC) capability for memory.

BACKGROUND

A memory device, such as dynamic random-access memory (DRAM), can include memory cells. Each memory cell can typically store one bit of information by holding or not holding a charge in, for example, a capacitor. The presence or absence of a charge indicates, for example, logic 1 when a charge is stored, and logic 0 when no charge is stored. Electrical disturbance, such as interference from noise or radiation, can change the contents of one or more memory cells or interfere with the circuitry used to read and write data to the memory cells. Furthermore, memory devices are being designed to operate at increasingly higher throughput rates and lower power consumption, which can lead to increasingly higher bit error rates. A bit error can cause corruption of data, security vulnerabilities, or a system crash.

Error correcting code (ECC) can be used to detect and correct bit errors. ECC encodes data by generating ECC data, e.g., redundancy bits or parity bits, that are stored along with the data in a memory device. For example, 8 parity bits can be generated for 32 bits of data or 64 bits of data. An ECC that generates 8 bits of parity for 32 bits of data can usually detect two bit errors and correct one bit error in the 32 bits of data. Similarly, an ECC that generates 8 parity bits for 64 bits of data can usually detect two bit errors and correct one bit error in the 64 bits of data.

Typically, an ECC memory device is used in a system to provide ECC capability. An ECC memory device can include an extra memory chip that is designated for storing ECC information. An ECC memory device can also include an interface that can provide simultaneous access to a data word and its corresponding ECC information. For example, an ECC memory device that can provide 8-bit parity for each 32-bit data word may include a 40-bit wide interface to access a 32-bit data word. Similarly, an ECC memory device that can provide 8-bit parity for each 64-bit data word may include a 72-bit wide interface to access a 64-bit data word.

Traditional ECC memory devices typically apply ECC protection to a data word by providing 8-bit parity for the data word. For example, a 40-bit ECC memory device supports 8-bit parity for a 32-bit data word, which provides 1-bit error correction and 2-bit error detection. When a complete 32-bit data word is to be written to the ECC memory, the ECC memory device can write the 32-bit data word and 8-bit parity to the ECC memory directly. When a partial 32-bit data word is to be written to the ECC memory, the ECC memory device may need to perform read-modify-write (RMW) to write the partial 32-bit data word and 8-bit parity to the ECC memory.

For RMW, the ECC memory device reads a 40-bit ECC code word (32-bit data word and 8-bit parity) corresponding to the partial 32-bit data word from the ECC memory and uses an ECC to perform error detection, correction, or both on the 32-bit data word read from the ECC memory. The partial 32-bit data word that is to be written to the ECC memory is then merged into the 32-bit data word read from the ECC memory to generate a new 32-bit data word. The ECC memory device generates a new 8-bit parity for the new 32-bit data word and writes the new ECC code word to the ECC memory.

However, RMW may significantly impact the performance of a memory device by decreasing data throughput and increasing access latency. To write a partial 32-bit or 64-bit data word to an ECC memory, the ECC memory device needs to perform a read operation and a write operation. This may decrease the rate at which data can be written to the memory device and increase the amount of time needed to write data to the memory device.

Additionally, a consumer may choose to use a system that does not support an ECC memory device, but may still desire ECC capability. A system that supports an ECC memory device may be associated with higher costs than a system that does not support an ECC memory device. For example, system components, such as motherboards, chipsets, and processors, that support ECC memory devices may be more expensive than system components that do not support ECC memory devices. Even when a system supports an ECC memory device, a consumer may choose to use a non-ECC memory device, but still desire ECC capability. An ECC memory device may be more expensive than a non-ECC memory device because of the extra memory chip and wider interface provided by the ECC memory device to implement ECC functionality.

SUMMARY

The present disclosure describes systems and techniques relating to ECC capability for memory. In general, in one aspect, the disclosure describes a controller that is configured to receive a memory access command that includes an address and a length associated with data that is to be transferred to or from the memory device, determine that the address is associated with a region of the memory device for storing error correcting code (ECC) protected data, generate a new address from the address included in the memory access command and a new length from the length included in the memory access command to account for data bytes and ECC bytes being interleaved throughout the region of the memory device, and transfer one or more bytes of data and one or more bytes of ECC information to or from locations of the memory device specified by the new address and the new length, the one or more bytes of the data and the one or more bytes of the ECC information being interleaved.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

Details of one or more implementations are set forth in the accompanying drawings and the description below. Other features, objects, and advantages may be apparent from the description and drawings, and from the claims.

DETAILED DESCRIPTION

Various implementations of the present disclosure are discussed below in the context of Low-Latency ECC (LL-ECC) capability for a memory device. The systems and techniques described in this disclosure are generally applicable to any memory device for which it is desirable to provide Low-Latency ECC capability. While specific implementations of memory and memory controllers are illustrated and described, many other memory and memory controller implementations may exist that include components different than those illustrated and described below.

Figure 1:
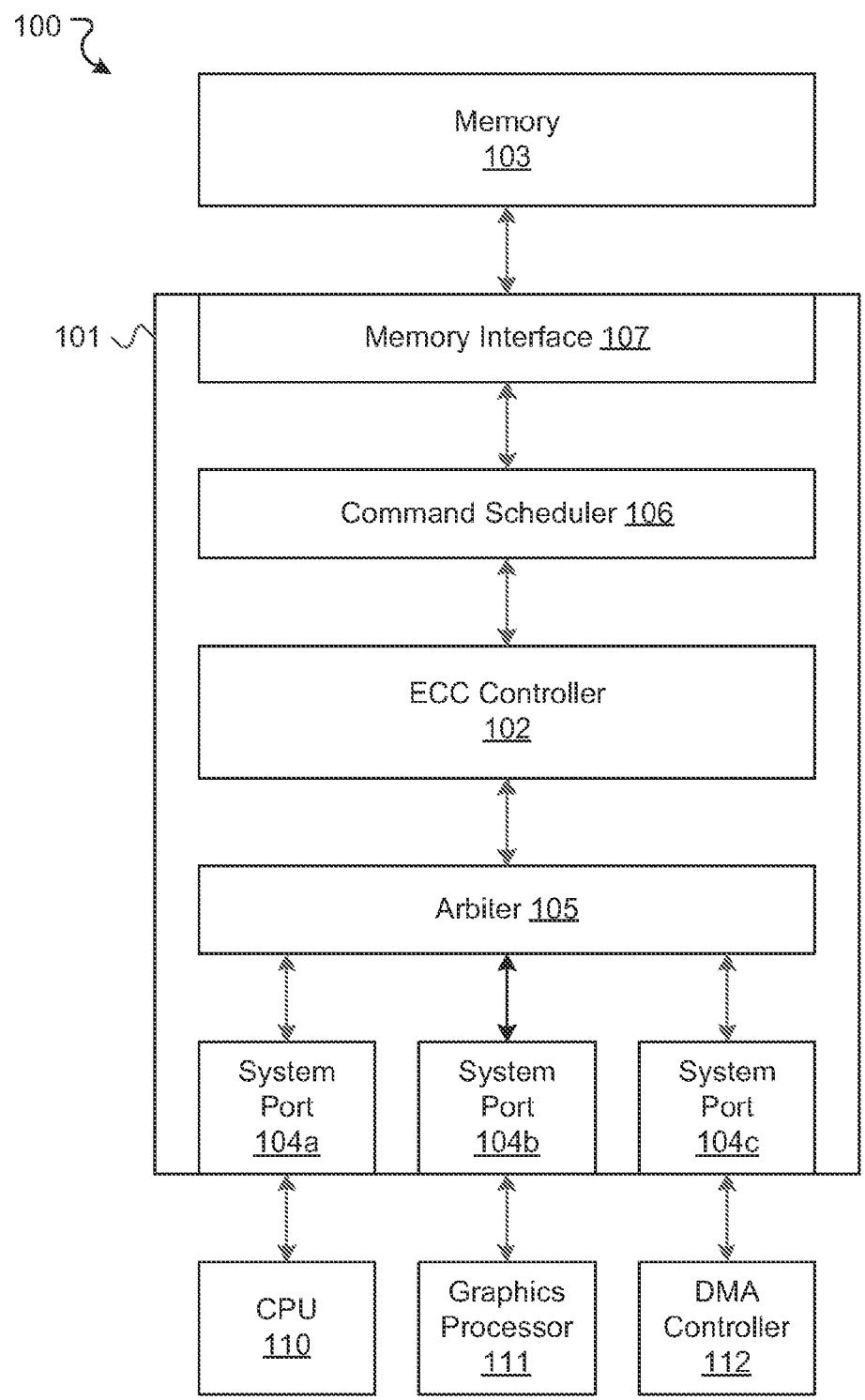
FIG. 1 is a block diagram showing an example of a system in which an ECC controller may be utilized to provide Low-Latency ECC (LL-ECC) capability for a memory.

FIG. 1 is a block diagram showing an example of a system 100 that includes a memory controller 101 in which an ECC controller 102 may be utilized to provide Low-Latency ECC (LL-ECC) capability for a memory 103. The memory controller 101 may include multiple system ports 104a, 104b and 104c, an arbiter 105, and a command scheduler 106. The system ports 104 may connect the memory controller 101 to other components of the system 100, such as a central processing unit (CPU) 110, a graphics processor 111, and a direct memory access (DMA) controller 112. The arbiter 105 may perform arbitration of memory access requests from the system ports 104. The command scheduler 106 may schedule memory access requests from the ECC controller 102 based on various factors, such as memory bank status, access priority, and access type (e.g., read or write).

The memory controller 101 includes a memory interface 107 that connects the memory controller 101 to the memory 103. The memory 103 may include any memory device for which it is desirable to provide LL-ECC capability. In some implementations, the memory 103 may include a volatile memory, such as random-access memory (RAM), including a dynamic random-access memory (DRAM), a static random-access memory (SRAM), a double data rate random-access memory (DDR RAM), or other similar devices. In some implementations, the memory 103 may include a non-volatile memory, such as a flash memory, a hard disk, a floppy disk, a magnetic tape, or other persistent storage devices. The memory 103 may include one or more memory devices, chips, or modules. Moreover, the memory controller 101 and the memory 103 can be included in an integrated circuit device, such as a system on chip (SoC) device.

The ECC controller 102 provides LL-ECC capability for the memory 103. Providing LL-ECC capability for a non-ECC memory may reduce the cost typically associated with a system having traditional ECC capability because a non-ECC memory is typically less expensive and uses less power than an ECC memory. A non-ECC memory is an integrated circuit device without ECC circuitry built into the device, whereas an ECC memory is an integrated circuit device with ECC circuitry built into the device. ECC circuitry built into an ECC memory may include an ECC controller, an additional memory chip, and a wider interface. Even though an ECC memory may include an additional memory chip and a wider interface, a non-ECC memory and an ECC memory can provide the same data throughput.

LL-ECC capability may be provided for an ECC memory device that includes ECC circuitry built into the device, for example, a 40-bit or a 72-bit interface. The LL-ECC capability may be provided in addition to or as an alternative to the traditional ECC capabilities provided by the ECC memory device. Providing LL-ECC capability for an ECC memory may improve the performance of the ECC memory with respect to data protected by LL-ECC compared to the traditional ECC used by the ECC memory. For example, read-modify-write (RMW) operations can be avoided when using LL-ECC to protect data written to the ECC memory. The ECC controller 102 can write a 2-byte ECC code word (1-byte data and corresponding 1-byte ECC information) to the ECC memory directly. To write a 2-byte ECC code word to the ECC memory, the ECC controller 102 can use a data mask, or write strobe, to indicate that two bytes of a data word corresponding to the 2-byte ECC code word are to be updated and the other two bytes of the data word are not to be updated.

In contrast, to write a byte of data to an ECC memory using traditional ECC, the ECC memory device may need to perform RMW operations to update a 40-bit ECC code word (4-byte data word and 1-byte parity) with the byte of data. The ECC memory device reads the 40-bit ECC code word that includes the 4-byte data word and 1-byte parity corresponding to the byte of data that is to be written from the ECC memory and uses an ECC to perform error detection, correction, or both on the 4-byte data word read from the ECC memory. The byte of data that is to be written to the ECC memory is then merged into the 4-byte data word read from the ECC memory to generate a new 4-byte data word. The ECC memory device generates a new 1-byte parity for the new 4-byte data word and writes the new ECC code word to the ECC memory. Applying LL-ECC protection to the data written to the ECC memory may thus increase the data throughput and decrease the access latency as compared to the traditional ECC used by the ECC memory because RMW operations can be avoided when writing a partial data word to the memory.

Furthermore, LL-ECC provides stronger ECC protection and shorter access latency than ECC performed on larger blocks of data, as provided by traditional ECC memory devices. For LL-ECC, the ECC controller 102 generates a 1-byte parity for each byte of data, which can provide each byte of data with 1-bit error correction and 2-bit error detection. In contrast, a 40-bit ECC memory supports 8-bit (1-byte) parity for a 32-bit (4-byte) data word, which typically provides the 4-byte data word with 1-bit error correction and 2-bit error detection. Thus, LL-ECC may be suitable for memory accesses with random addresses and low latency access requirements, such as instruction fetch. LL-ECC may be suitable for protecting critical system data for which strong ECC protection is desirable.

The ECC controller 102 may use any suitable ECC to perform LL-ECC, such as enhanced Hamming code or Bose-Chaudhuri-Hocquenghem (BCH) code. Using enhanced Hamming code to protect data may provide each byte of data with 1-bit error correction and 2-bit error detection. Using BCH code to protect data may provide each byte of data with 2-bit error correction.

Figure 2:
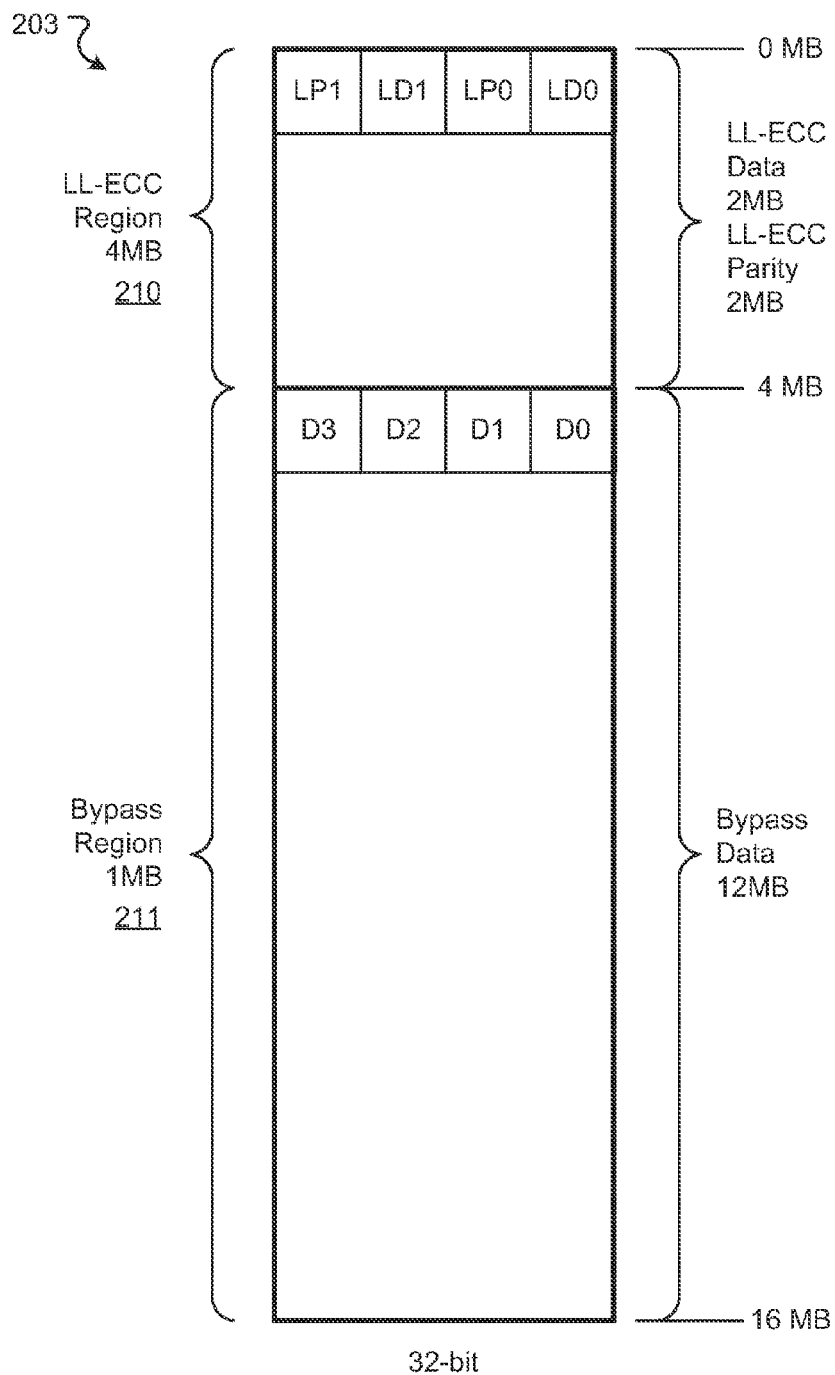
FIG. 2 shows an example of a memory having an LL-ECC region that stores data that are processed using LL-ECC.

FIG. 2 shows an example of a memory 203 having an LL-ECC region 210 that stores data that are processed using LL-ECC. The memory 203, as shown in FIG. 2, is a 32-bit memory having a capacity of 16 megabytes (MB). The memory 203 may include the LL-ECC region 210 and bypass region 211. A region may be a contiguous range of physical memory addresses. A region can be divided into individual bits or larger aggregate data units such as bytes.

The LL-ECC region 210 may be defined as the region from 0 MB to 4 MB with a total size of 4 MB. The LL-ECC region 210 stores data processed using LL-ECC and corresponding ECC information. Two megabytes of the LL-ECC region is used to store the data, and two megabytes of the LL-ECC region is used to store the ECC information. In some implementations, a data byte and its corresponding ECC byte are stored in adjacent byte locations. For example, as shown in FIG. 2, data byte LD0 is stored adjacent to its parity byte LP0. An ECC controller can write a 2-byte ECC code word, for example, ECC code word with data byte LD0 and parity byte LP0, to the memory 203 directly without performing RMW operations because one data byte corresponds to one ECC byte. Writing the 2-byte ECC code word to the memory 203 directly provides low latency ECC as compared to the traditional ECC used by an ECC memory.

The ECC byte may include any number of ECC bits depending on, for example, the ECC used to perform LL-ECC. For example, performing LL-ECC using enhanced Hamming code generates a 5-bit ECC data (e.g., a 4-bit Hamming check and 1-bit overall parity). In this implementation, LL-ECC provides 1-bit error correction capability. As another example, performing LL-ECC using BCH code generates a 8-bit ECC data, which uses a full ECC byte. In this implementation, LL-ECC provides 2-bit error correction capability.

Other components in the system may access half of the address space in the LL-ECC region 210. The components may access data in the LL-ECC region 210 using addresses of locations in the memory 203 from 0 MB to 2 MB. In some implementations, any memory access specifying an address in the LL-ECC region 210 from 2 MB to 4 MB is illegal. An illegal access may cause an error flag to be set, an error interrupt to be generated, or an error log to be created.

When an ECC controller receives an access request with an address specifying a valid location of data in the LL-ECC region 210, the ECC controller may translate the received address to an address of the actual location of the data in the LL-ECC region 210. The address of the actual location of the data may be different than the received address because ECC bytes are interleaved with the data bytes for storage in the LL-ECC region 210. Data bytes and ECC bytes are interleaved for storage in the LL-ECC region 210 so that the ECC controller can access a data byte and its corresponding ECC byte by reading a single data word from the memory. In contrast, to access a data byte and its corresponding ECC byte in a traditional ECC memory that stores the data byte and the ECC byte in separate regions of the memory, an ECC controller may need to read two data words, e.g., one data word that includes the data byte and one data word that includes the ECC byte. Because the ECC controller reads a single data word from memory to access an ECC code word that includes a data byte and an ECC byte, LL-ECC can provide low latency access to ECC code words in the memory.

The bypass region 211 may be defined as the region from 4 MB to 16 MB with a total size of 12 MB. The bypass region 211 stores data that are not protected by ECC. All addresses in the bypass region 211 may be accessible to other components of the system.

Figure 3:
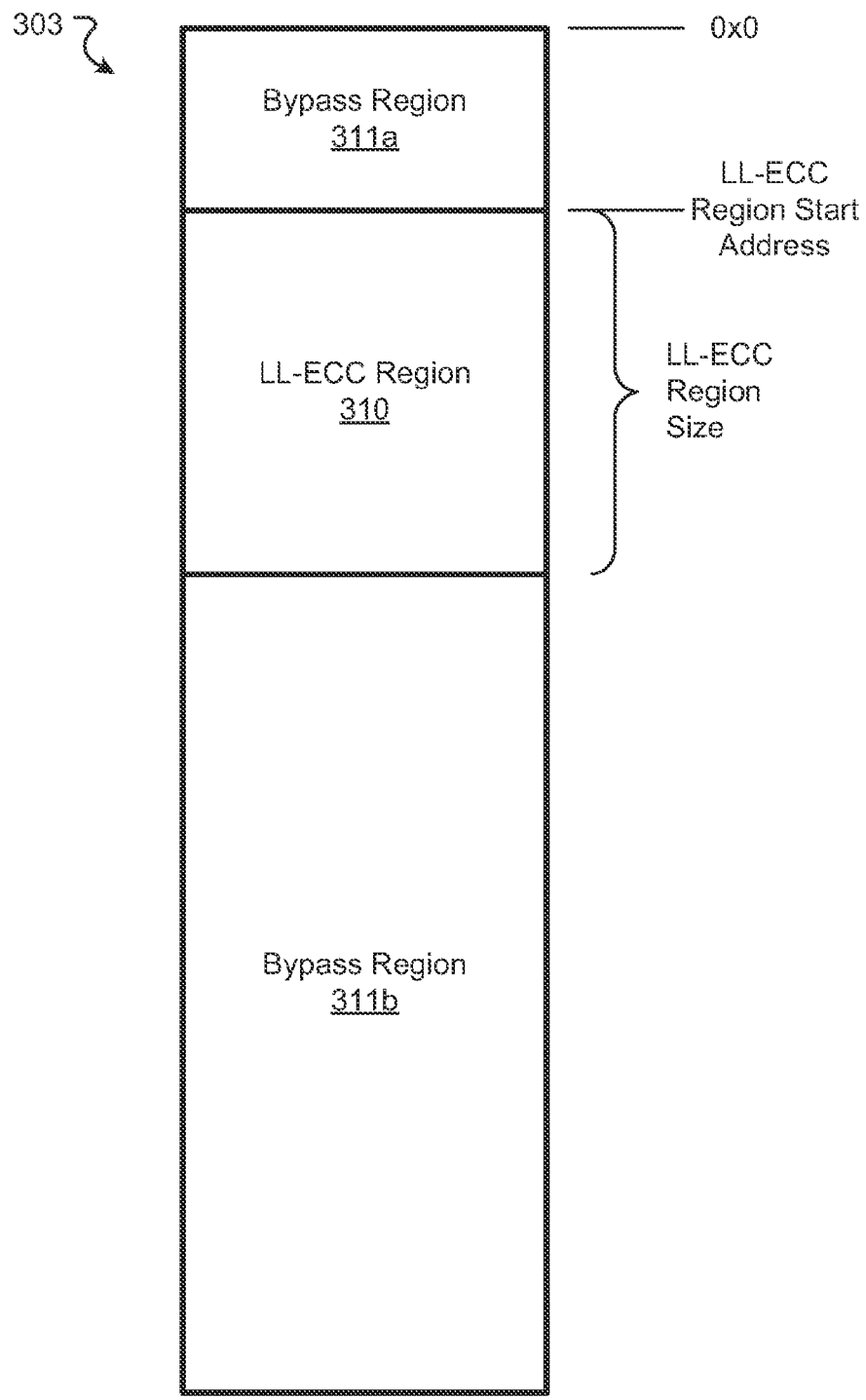
FIG. 3 shows an example of a memory having an LL-ECC region defined by an LL-ECC region start address and an LL-ECC region size.

FIG. 3 shows an example of a memory 303 having an LL-ECC region 310 defined by an LL-ECC region start address and an LL-ECC region size. The LL-ECC region start address may be any address in the memory space of memory 303. The rest of the memory 303 may be defined as one or more bypass regions 311a and 311b.

Although FIGS. 2 and 3 show a memory with two different regions with one LL-ECC region, a memory may include any number of different regions. Each region may be independently configured as an LL-ECC region or a non-LL-ECC region. A memory may thus include any number of separate LL-ECC regions.

Figure 4:
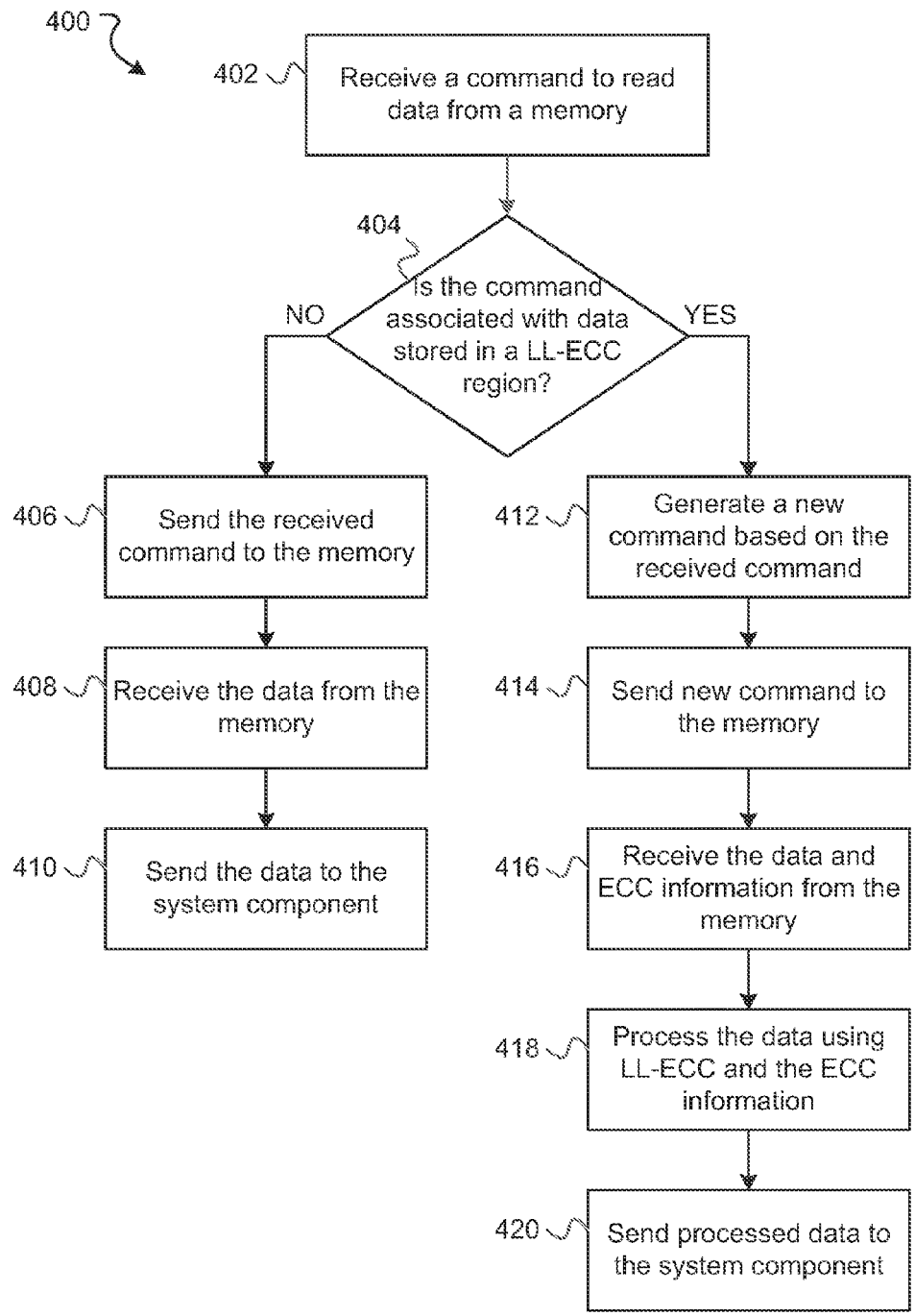
FIG. 4 is a flowchart showing examples of operations performed by an ECC controller to read data from a memory.

FIG. 4 is a flowchart showing examples of operations 400 performed by an ECC controller to read data from a memory. At 402, the ECC controller receives a command from a system component to read data from a memory. The command includes an address of a location of the memory associated with the data and a length of the data.

At 404, the ECC controller determines whether the command is associated with data stored in an LL-ECC region of the memory. The ECC controller may use the address included in the command to determine whether the command is associated with data stored in the LL-ECC region. If the address specifies a location in a region defined by the LL-ECC start address and the LL-ECC region size, the command is associated with data stored in the LL-ECC region. If the address does not specify a location in the region defined by the LL-ECC start address and the LL-ECC region size, the command is not associated with data stored in the LL-ECC region.

If the ECC controller determines that the command is not associated with data stored in the LL-ECC region at 404, the ECC controller sends the received command to the memory at 406. At 408, the ECC controller receives data from the memory. At 410, the ECC controller sends the data to the system component.

If the ECC controller determines that the command is associated with data stored in the LL-ECC region at 404, the ECC controller generates a new command based on the command received from the system component at 412. To generate the new command, the ECC controller translates the address included in the received command to an address of an actual location in the LL-ECC region where the data is stored. The ECC controller translates the address included in the received command based on the one-to-one relationship between the number of data bytes and the number of parity bytes. The address of the actual location may be calculated as follows: actual address=2×(received address−LL-ECC start address)+LL-ECC start address.

The ECC controller translates the length included in the received command to a length that specifies the length of the data and its corresponding ECC information. The ECC controller translates the length included in the received command based on the one-to-one relationship between the number of data bytes and the number of parity bytes. The length of the data and its corresponding ECC information may be calculated as follows: actual length=2×received length. The ECC controller generates a new command with the actual address and the actual length associated with the data.

At 414, the ECC controller sends the new command to the memory. At 416, the ECC controller receives data and ECC information from the memory. At 418, the ECC controller processes the data using LL-ECC and the ECC information to perform error detection, correction, or both on the data. At 420, the ECC controller sends the processed data to the system component.

Figure 5:
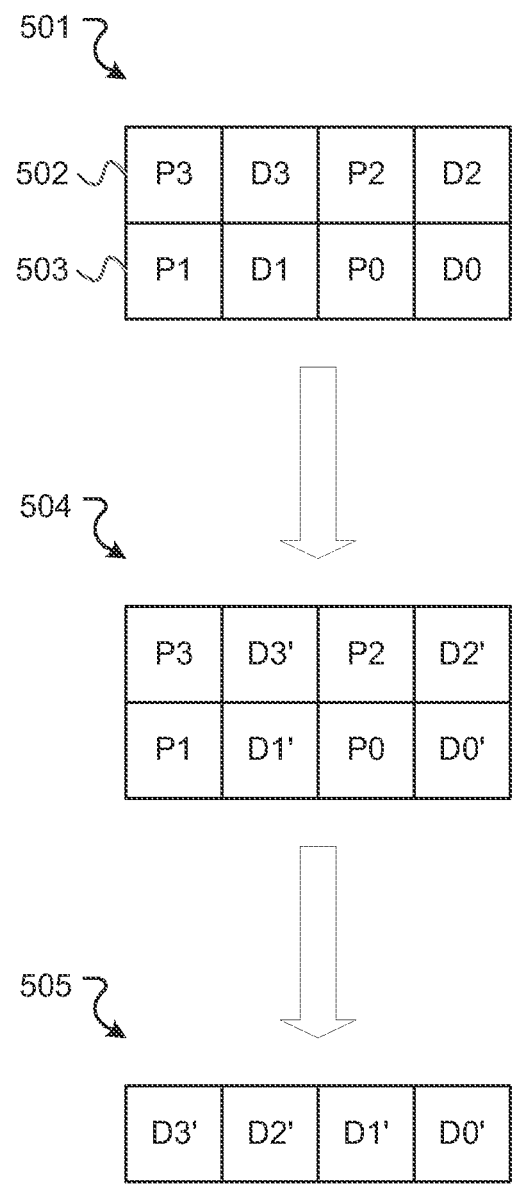
FIG. 5 shows examples of data formats of data and ECC information that is read from a memory at different stages of LL-ECC processing.

FIG. 5 shows examples of data formats of the data and ECC information that is read from the memory at different stages of LL-ECC processing. The data 501 received from the memory includes two 4-byte data words 502 and 503. A data word is the largest unit of data that can be transferred to and from the memory in a single operation.

The ECC byte P0 is stored adjacent to its corresponding data byte D0. The ECC byte P1 is stored adjacent to its corresponding data byte D1. The ECC byte P2 is stored adjacent to its corresponding data byte D2. The ECC byte P3 is stored adjacent to its corresponding data byte D3. The data bytes D0, D1, D2, D3 and the ECC bytes P0, P1, P2, P3 are interleaved in the received data 501.

The ECC controller processes the received data 501 by performing error detection, correction, or both on the data bytes using LL-ECC. The ECC controller performs error detection, correction, or both on each data byte D0, D1, D2, D3 using its corresponding ECC byte P0, P1, P2, P3 to generate processed data 504. The processed data 504 includes a corrected data byte D0', D1', D2', D3' for each data byte D0, D1, D2, D3 and corresponding ECC bytes P0, P1, P2, P3. If a received data byte does not have any bit errors, the corrected data byte may be the same as the received data byte. The ECC controller sends the corrected data 505 that includes the corrected data bytes D0', D1', D2', D3' to the system component that requested the data.

Figure 6:
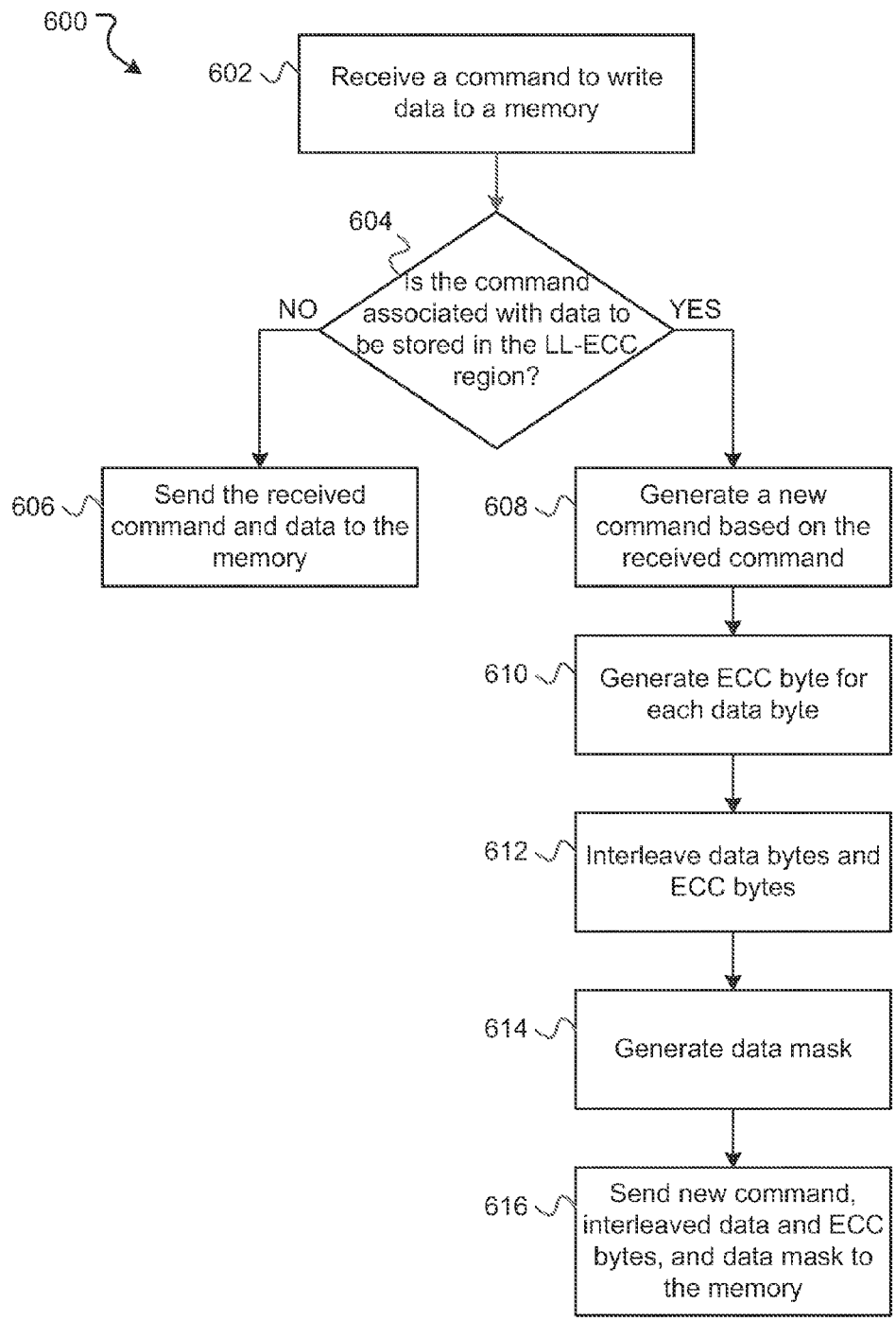
FIG. 6 is a flowchart showing examples of operations performed by an ECC controller to write data to a memory.

FIG. 6 is a flowchart showing examples of operations 600 performed by an ECC controller to write data to a memory. At 602, the ECC controller receives a command from a system component to write data to a memory. The command includes an address of a location of the memory associated with the data and a length of the data.

At 604, the ECC controller determines whether the command is associated with data that is to be stored in an LL-ECC region of the memory. The ECC controller may use the address included in the command to determine whether the command is associated with data that is to be stored in the LL-ECC region. If the address specifies a location in a region defined by the LL-ECC start address and the LL-ECC region size, the command is associated with data that is to be stored in the LL-ECC region. If the address does not specify a location in the region defined by the LL-ECC start address and the LL-ECC region size, the command is not associated with data that is to be stored in the LL-ECC region.

If the ECC controller determines that the command is not associated with data that is to be stored in the LL-ECC region at 604, the ECC controller sends the received command and the data that is to be stored in the memory to the memory at 606.

If the ECC controller determines that the command is associated with data that is to be stored in the LL-ECC region at 604, the ECC controller generates a new command based on the command received from the system component at 608.

To generate the new command, the ECC controller translates the address included in the received command to an address of an actual location in the LL-ECC region where the data is to be stored. The address of the actual location may be calculated as follows: actual address=2×(received address−LL-ECC start address)+LL-ECC start address. The ECC controller translates the length included in the received command to a length that specifies the length of the data and its corresponding ECC information. The length of the data and its corresponding ECC information may be calculated as follows: actual length=2×received length. The ECC controller generates a new command with the actual address and the actual length associated with the data.

The ECC controller processes the data to be stored to the memory using LL-ECC. At 610, to process the data using LL-ECC, the ECC controller generates an ECC byte for each byte of data. At 612, the ECC controller interleaves the data bytes and the ECC bytes such that an ECC byte is stored adjacent to its corresponding data byte. The ECC controller formats the interleaved data and ECC bytes into one or more ECC code words to be written to the memory. Each ECC code word includes a data byte and an ECC byte.

At 614, the ECC controller generates a data mask, or write strobe, for writing the data bytes and the ECC bytes to the memory. The ECC controller may generate a data mask when one or more ECC code words form a portion of a data word, for example, a portion of a 4-byte or 8-byte data word, that is to be written to the memory. The data mask allows a partial data word to be written to the memory without overwriting the whole data word. A data mask indicates which bytes of the data word are valid for writing to the memory. The bytes of the data word that are valid for writing to the memory include the bytes of data and the bytes of ECC information.

For example, when one ECC code word that includes one data byte and one ECC byte is to be written to a 32-bit memory (corresponding to a data word of 4-bytes), the ECC controller may generate a 4-byte data mask. The 4-byte data mask indicates that two bytes corresponding to the data byte and the ECC byte in the 4-byte data word are valid for writing to the memory and that the other two bytes in the 4-byte data word does not need to be updated in the memory when writing the one ECC code word to the memory.

At 616, the ECC controller sends the new command, the interleaved data and ECC bytes, and the data mask to the memory for storing of the data and ECC information to the memory. When the memory receives the new command, the data to be written, and the data mask, the memory writes the data to the locations in the memory specified by the address and the length included in the new command. The memory uses the data mask to update the data words of the memory corresponding to the address and the length with the data bytes and ECC bytes.

Figure 7:
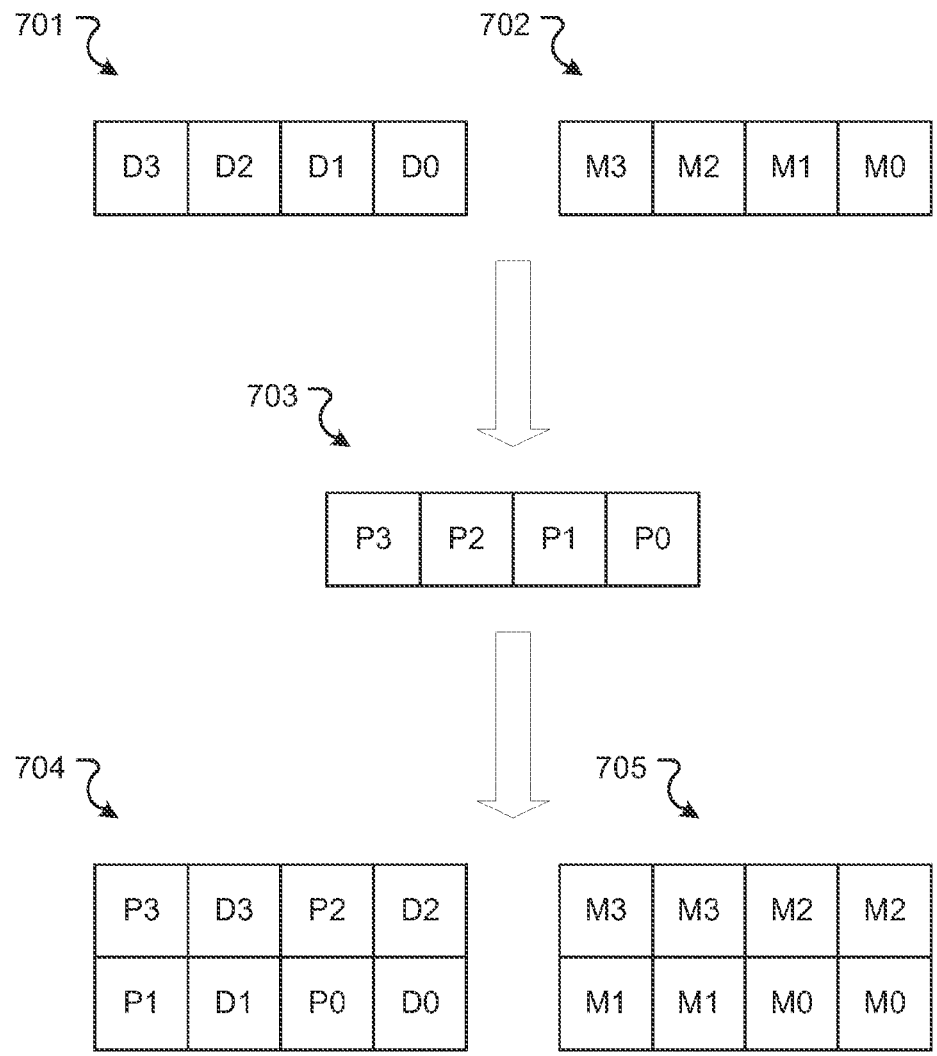
FIG. 7 shows examples of data formats of the data and ECC information that is to be written to a memory at different stages of LL-ECC processing.

FIG. 7 shows examples of data formats of the data and ECC information that is to be written to the memory at different stages of LL-ECC processing. The data 701 received from the system component includes data bytes D0, D1, D2, D3. The ECC controller may generate a data mask 702 with mask bits M0, M1, M2, M3 for each data byte D0, D1, D2, D3. The data mask 702 indicates which bytes in the data 701 are valid for writing to the memory. The data mask 702 may be a low active mask, where a logic 1 masks the corresponding byte and a logic 0 writes the corresponding byte.

The ECC controller processes the received data 701 using LL-ECC to generate ECC data 703. The ECC controller applies LL-ECC to each data byte D0, D1, D2, D3 to generate a corresponding ECC byte P0, P1, P2, P3 for each data byte D0, D1, D2, D3. The ECC data 703 includes ECC bytes P0, P1, P2, P3 corresponding to data bytes D0, D1, D2, D3.

The ECC controller interleaves the received data 701 and the ECC data 703 to generate the write data 704. In the write data 704, the ECC byte P0 is placed adjacent to its corresponding data byte D0. The ECC byte P1 is placed adjacent to its corresponding data byte D1. The ECC byte P2 is placed adjacent to its corresponding data byte D2. The ECC byte P3 is placed adjacent to its corresponding data byte D3.

The ECC controller may generate a write mask 705. To generate the write mask 705, the ECC controller may duplicate each mask bit M0, M1, M2, M3 of the data mask 702 and interleave each duplicate bit into the data mask 702. The write mask 705 indicates which data bytes and ECC bytes in the write data 704 are valid for writing to the memory. The ECC controller sends the write data 704 and the write mask 705 to the memory for storing in the LL-ECC region of the memory.

Figure 8:
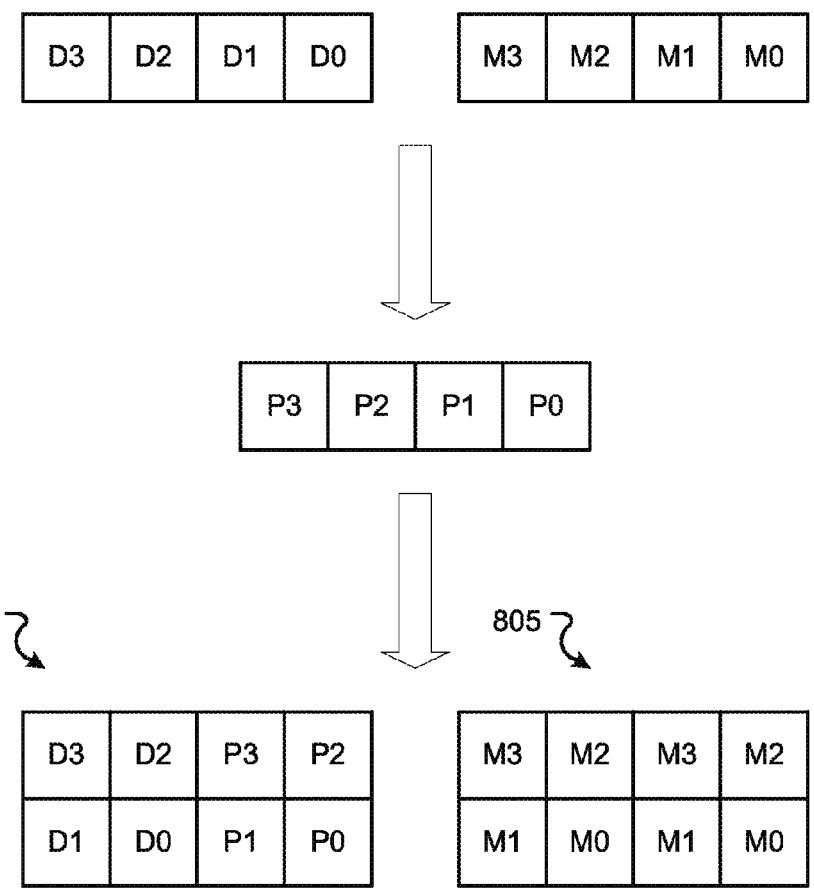
FIG. 8 shows other examples of data formats of the data and ECC information that is to be written to a memory at different stages of LL-ECC processing.

Although FIGS. 2, 5, and 7 show an ECC byte being stored adjacent to its corresponding data byte, an ECC byte may be stored at any byte location in the same 4-byte data word as its corresponding data byte. For example, FIG. 8 shows other examples of data formats of the data and ECC information that is to be written to the memory at different stages of LL-ECC processing. In FIG. 8, a write data 804 is formatted such that the data bytes are placed in the first two bytes of the data word and the ECC bytes are placed in the last two bytes of the data word. The ECC controller may generate a write mask 805 corresponding to the write data 804.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including system on chip (SoC) implementations.

While this specification contains many specifics, these should not be construed as limitations on the scope of what may be claimed, but rather as descriptions of features that may be specific to particular embodiments. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Other implementations fall within the scope of the following claims. For example, in some implementations, the described systems and techniques may be applicable to a traditional ECC memory device to provide ECC capability that is stronger than the ECC capability provided by the ECC memory device.

What is claimed is:

1. An apparatus, comprising:
   a memory interface configured to communicate with a memory device;
   a controller coupled to the memory interface, the controller configured to:
      receive a memory access command that includes an address and a length associated with data that is to be transferred to or from the memory device; and
      transfer one or more bytes of data and one or more bytes of error correcting code (ECC) information to or from locations of the memory device associated with the address and the length, the one or more bytes of the data and the one or more bytes of the ECC information being interleaved.

2. The apparatus of claim 1, wherein the controller is further configured to:
   determine that the address is associated with a region of the memory device for storing ECC protected data;
   generate a new address from the address included in the memory access command and a new length from the length included in the memory access command to account for data bytes and ECC bytes being interleaved within the region of the memory device; and
   transfer the one or more bytes of data and the one or more bytes of ECC information to or from locations of the memory device specified by the new address and the new length.

3. The apparatus of claim 2, wherein the controller configured to generate the new address and the new length comprises the controller further configured to generate the new address and the new length based on a start address of the region of the memory device for storing ECC protected data.

4. The apparatus of claim 1, wherein the memory access command is a data read command, and the controller is further configured to perform error detection or correction on each byte of the one or more bytes of data using a byte of the one or more bytes of ECC information that is stored adjacent to the byte of data.

5. The apparatus of claim 1, wherein the memory access command is a data write command, and the controller is further configured to:
   generate a byte of the one or more bytes of ECC information for each byte of the one or more bytes of data; and
   interleave the one or more bytes of ECC information and the one or more bytes of data.

6. The apparatus of claim 4, wherein the one or more bytes of data and the one or more bytes of ECC information form a portion of a data word, and the controller is further configured to generate a data mask for writing the one or more bytes of data and the one or more bytes of ECC information to the memory device, the data mask indicating which bytes of the data word include the one or more bytes of data and the one or more bytes of ECC information.

7. The apparatus of claim 1, wherein the controller is further configured to:
   define the region of the memory device for storing ECC protected data; and
   define one or more regions of the memory device for storing data that is not ECC protected.

8. The apparatus of claim 1, wherein the memory interface configured to communicate with the memory device comprises the memory interface further configured to communicate with a non-ECC memory device.

9. A system, comprising:
   a memory device; and
   a controller configured to:
   receive a memory access command that includes an address and a length associated with data that is to be transferred to or from the memory device;
   determine that the address is associated with a region of the memory device for storing error correcting code (ECC) protected data;
   generate a new address from the address included in the memory access command and a new length from the length included in the memory access command to account for data bytes and ECC bytes being interleaved within the region of the memory device; and
   transfer one or more bytes of data and one or more bytes of ECC information to or from locations of the memory device specified by the new address and the new length, the one or more bytes of the data and the one or more bytes of the ECC information being interleaved.

10. The system of claim 9, wherein the controller configured to generate the new address and the new length comprises the controller further configured to generate the new address and the new length based on a start address of the region of the memory device for storing ECC protected data.

11. The system of claim 9, wherein the memory access command is a data read command, and the controller is further configured to perform error detection or correction on each byte of the one or more bytes of data using a byte of the one or more bytes of ECC information that is stored adjacent to the byte of data.

12. The system of claim 9, wherein the memory access command is a data write command, and the controller is further configured to:
   generate a byte of the one or more bytes of ECC information for each byte of the one or more bytes of data; and
   interleave the one or more bytes of ECC information and the one or more bytes of data.

13. The system of claim 12, wherein the one or more bytes of data and the one or more bytes of ECC information form a portion of a data word, and the controller is further configured to generate a data mask for writing the one or more bytes of data and the one or more bytes of ECC information to the memory device, the data mask indicating which bytes of the data word include the one or more bytes of data and the one or more bytes of ECC information.

14. The system of claim 9, wherein the controller is further configured to:
   define the region of the memory device for storing ECC protected data; and
   define one or more regions of the memory device for storing data that is not ECC protected.

15. The system of claim 9, wherein the memory device comprises a non-ECC memory device.

16. A method, comprising:
   receiving a memory access command that includes an address and a length associated with data that is to be transferred to or from the memory device; and
   transferring one or more bytes of data and one or more bytes of error correcting code (ECC) information to or from locations of the memory device associated with the address and the length, the one or more bytes of the data and the one or more bytes of the ECC information being interleaved.

17. The method of claim 16, further comprising:
   determining that the address is associated with a region of the memory device for storing ECC protected data;
   generating a new address from the address included in the memory access command and a new length from the length included in the memory access command to account for data bytes and ECC bytes being interleaved within the region of the memory device; and
   transferring the one or more bytes of data and the one or more bytes of ECC information to or from locations of the memory device specified by the new address and the new length.

18. The method of claim 17, wherein generating the new address and the new length comprises generating the new address and the new length based on a start address of the region of the memory device for storing ECC protected data.

19. The method of claim 16, wherein the memory access command is a data read command, and the method further comprises performing error detection or correction on each byte of the one or more bytes of data using a byte of the one or more bytes of ECC information that is stored adjacent to the byte of data.

20. The method of claim 16, wherein the memory access command is a data write command, and the method further comprises:
   generating a byte of the one or more bytes of ECC information for each byte of the one or more bytes of data; and
   interleaving the one or more bytes of ECC information and the one or more bytes of data.

21. The method of claim 19, wherein the one or more bytes of data and the one or more bytes of ECC information form a portion of a data word, and the method further comprises generating a data mask for writing the one or more bytes of data and the one or more bytes of ECC information to the memory device, the data mask indicating which bytes of the data word include the one or more bytes of data and the one or more bytes of ECC information.

22. The method of claim 16, further comprising:
   defining the region of the memory device for storing ECC protected data; and
   defining one or more regions of the memory device for storing data that is not ECC protected.

23. The method of claim 16, wherein the memory device comprises a non-ECC memory device.

* * * * *